(12) United States Patent
Liu

(10) Patent No.: US 11,380,743 B2
(45) Date of Patent: Jul. 5, 2022

(54) OLED DISPLAY DEVICE INCLUDING A PLURALITY OF STRIP-SHAPED GROOVES AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventor: Wei Liu, Wuhan (CN)

( * ) Notice: Subject to any disclaimer, the term of this patent is extended or adjusted under 35 U.S.C. 154(b) by 253 days.

(21) Appl. No.: 16/755,889

(22) PCT Filed: Feb. 17, 2020

(86) PCT No.: PCT/CN2020/075495
§ 371 (c)(1),
(2) Date: Apr. 14, 2020

(87) PCT Pub. No.: WO2021/138962
PCT Pub. Date: Jul. 15, 2021

(65) Prior Publication Data
US 2022/0005893 A1 Jan. 6, 2022

(30) Foreign Application Priority Data
Jan. 8, 2020 (CN) .......................... 202010017210.7

(51) Int. Cl.
*H01L 29/08* (2006.01)
*H01L 27/32* (2006.01)
*H01L 51/50* (2006.01)
*H01L 51/56* (2006.01)

(52) U.S. Cl.
CPC ...... *H01L 27/3246* (2013.01); *H01L 51/5056* (2013.01); *H01L 51/5072* (2013.01); *H01L 51/5092* (2013.01); *H01L 51/56* (2013.01); *H01L 2227/323* (2013.01)

(58) Field of Classification Search
CPC .................................................. H01L 27/3246
See application file for complete search history.

(56) References Cited

U.S. PATENT DOCUMENTS

| 8,018,141 B2 * | 9/2011 | Kim ..................... H01L 51/5206 313/506 |
| 8,822,998 B2 * | 9/2014 | Kim ..................... H01L 27/326 313/506 |
| 9,324,947 B2 * | 4/2016 | Sato ..................... H01L 51/0015 |

(Continued)

FOREIGN PATENT DOCUMENTS

| CN | 1773716 A | 5/2006 |
| CN | 108074951 A | 5/2018 |

(Continued)

*Primary Examiner* — Caleb E Henry

(57) ABSTRACT

An organic light-emitting diode (OLED) display device and a manufacturing method thereof are provided. The OLED display device includes a substrate, a thin-film transistor array substrate, a plurality of anodes, a pixel-defining layer, a plurality of strip-shaped grooves, a light-emitting functional layer, and a cathode disposed on the light-emitting functional layer, wherein the plurality of strip-shaped grooves block a lateral current between each of a plurality of pixel regions, thereby relieving a problem of current crosstalk between adjacent pixels.

19 Claims, 3 Drawing Sheets

(56) References Cited

U.S. PATENT DOCUMENTS

| | | | |
|---|---|---|---|
| 9,614,015 B2* | 4/2017 | Park | H01L 51/5209 |
| 9,716,208 B2* | 7/2017 | Dozen | H01L 27/3246 |
| 10,916,723 B2* | 2/2021 | Lee | H01L 51/56 |
| 2004/0096697 A1 | 5/2004 | Tai et al. | |
| 2004/0228964 A1* | 11/2004 | Ito | H01L 51/0005 |
| | | | 427/256 |
| 2006/0097263 A1* | 5/2006 | Lee | H01L 27/3246 |
| | | | 257/72 |
| 2007/0159089 A1* | 7/2007 | Oh | H01L 51/5246 |
| | | | 313/506 |
| 2009/0128020 A1* | 5/2009 | Takei | H01L 27/3223 |
| | | | 313/504 |
| 2010/0181559 A1* | 7/2010 | Nakatani | H01L 27/3283 |
| | | | 438/34 |
| 2011/0233572 A1* | 9/2011 | Nakatani | H01L 27/3246 |
| | | | 257/88 |
| 2011/0260955 A1* | 10/2011 | Yoshida | H01L 27/3283 |
| | | | 345/76 |
| 2013/0099221 A1* | 4/2013 | Kawamura | H01L 51/52 |
| | | | 438/34 |
| 2013/0234126 A1* | 9/2013 | Nakatani | H01L 27/3283 |
| | | | 438/34 |
| 2014/0159074 A1* | 6/2014 | Isobe | H01L 27/3288 |
| | | | 438/34 |
| 2014/0346449 A1 | 11/2014 | Choi et al. | |
| 2015/0171327 A1* | 6/2015 | Matsushima | H01L 27/3218 |
| | | | 438/35 |
| 2016/0093680 A1* | 3/2016 | Paek | H01L 51/5228 |
| | | | 438/34 |
| 2018/0254303 A1* | 9/2018 | Mishima | H01L 51/5206 |
| 2020/0006661 A1* | 1/2020 | Shinokawa | B23K 26/123 |
| 2020/0194513 A1* | 6/2020 | Kim | H01L 51/5056 |
| 2020/0227661 A1* | 7/2020 | Nishikiori | H01L 51/0021 |
| 2021/0183972 A1* | 6/2021 | Son | H01L 27/3283 |

FOREIGN PATENT DOCUMENTS

| | | |
|---|---|---|
| CN | 109786578 A | 5/2019 |
| CN | 110289284 A | 9/2019 |

* cited by examiner

OLED DISPLAY DEVICE INCLUDING A PLURALITY OF STRIP-SHAPED GROOVES AND MANUFACTURING METHOD THEREOF

FIELD OF INVENTION

The present disclosure relates to the field of display technologies, and more particularly, to an organic light-emitting diode (OLED) display device and a manufacturing method thereof.

BACKGROUND OF INVENTION

Currently, organic light-emitting diode (OLED) displays have become an important display technology due to their outstanding characteristics of no backlight needed, high contrast, and ultra-lightweight and thinness. OLED displays are gradually replacing thin film transistor liquid crystal displays (TFT-LCDs), and are expected to become a next-generation mainstream display technology following LCDs.

A light-emitting portion of an OLED includes a hole injection layer, a hole transport layer, an electron blocking layer, a light-emitting layer, a hole blocking layer, an electron transport layer, an electron injection layer, and a cathode disposed sequentially. The hole injection layer and the hole transport layer are usually configured to be a common layer of each pixel to laterally transmit current to adjacent pixels. Particularly, transmitting current through the hole injection layer having better conductivity to make the adjacent pixels emit light.

Currently, current crosstalk phenomenon solutions mainly include reducing conductivity of the common layer and increasing distance between the pixels, but such solutions would cause disadvantages such as an increase in OLED voltage or a decrease in display quality.

SUMMARY OF INVENTION

In order to achieve the above object, the present disclosure provides an organic light-emitting diode (OLED) display device, including a substrate; a thin-film transistor array substrate disposed on the substrate; a plurality of anodes disposed on the thin-film transistor array substrate; a pixel-defining layer disposed between the plurality of anodes on the thin-film transistor array substrate and separating the plurality of anodes, wherein a plurality of strip-shaped grooves are provided on the pixel-defining layer; a light-emitting functional layer covering the plurality of anodes and the pixel-defining layer; and a cathode disposed on the light-emitting functional layer; wherein the light-emitting functional layer comprises a hole injection layer covering the plurality of anodes and the pixel-defining layer, and a thickness of the hole injection layer is less than a depth of the plurality of strip-shaped grooves.

In one embodiment of the present disclosure, a width of each of the plurality of strip-shaped grooves ranges from 0.1 µm to 30 µm, and a depth of each of the plurality of strip-shaped grooves ranges from 10 nm to 200 nm.

In one embodiment of the present disclosure, the substrate is a rigid substrate or a flexible substrate, the rigid substrate is preferably a glass, and the flexible substrate is preferably a polyimide film.

In one embodiment of the present disclosure, the plurality of strip-shaped grooves comprise at least two groove extending directions perpendicular to each other, and the grooves with different groove extending directions are not connected.

In one embodiment of the present disclosure, a groove extending direction of each of the plurality of strip-shaped grooves is perpendicular to a direction of a connection line of two midpoints of the anodes adjacent to the strip-shaped groove.

In one embodiment of the present disclosure, an included angle of a groove extending direction of each of the plurality of strip-shaped grooves and a direction of a connection line of two midpoints of the anodes adjacent to the strip-shaped groove ranges from 60 to 90 degrees.

In one embodiment of the present disclosure, the plurality of strip-shaped grooves comprise at least two groove extending directions, and the strip-shaped grooves with different groove extending directions are staggered with each other.

In one embodiment of the present disclosure, the light-emitting functional layer further comprises a hole transport layer, a light-emitting layer, an electron transport layer, and an electron injection layer sequentially disposed on the hole injection layer.

To achieve the above object, the present disclosure also provides a method of manufacturing an organic light-emitting diode (OLED) display device, including providing a thin-film transistor array substrate, and forming a plurality of anodes distributed at intervals on the thin-film transistor array substrate; forming a pixel-defining layer on the thin-film transistor array substrate, wherein the pixel-defining layer is disposed between the plurality of anodes and separates the plurality of anodes; forming a plurality of strip-shaped grooves on the pixel-defining layer; forming a light-emitting functional layer on the plurality of anodes and the pixel-defining layer; and forming a cathode on the light-emitting functional layer; wherein the light-emitting functional layer comprises a hole injection layer covering the plurality of anodes and the pixel-defining layer.

In one embodiment of the present disclosure, a thickness of the hole injection layer is less than a depth of the plurality of strip-shaped grooves.

According to an OLED display device and a manufacturing method thereof disclosed in the present disclosure, the OLED display device includes a substrate; a thin-film transistor array substrate disposed on the substrate; a plurality of anodes disposed on the thin-film transistor array substrate; a pixel-defining layer disposed between the plurality of anodes on the thin-film transistor array substrate and separating the plurality of anodes, wherein a plurality of strip-shaped grooves are provided on the pixel-defining layer; a light-emitting functional layer covering the plurality of anodes and the pixel-defining layer; and a cathode disposed on the light-emitting functional layer, wherein the light-emitting functional layer includes a hole injection layer covering the plurality of anodes and the pixel-defining layer. A thickness of the hole injection layer is less than a depth of the plurality of strip-shaped grooves, wherein the plurality of strip-shaped grooves block a lateral current between each of a plurality of pixel regions, thereby relieving a problem of current crosstalk between adjacent pixels.

DESCRIPTION OF DRAWINGS

In order to make the above content of the present disclosure more comprehensible, the following describes the preferred embodiments in detail with the accompanying figures as follows.

DETAILED DESCRIPTION OF PREFERRED EMBODIMENTS

Figure 1:
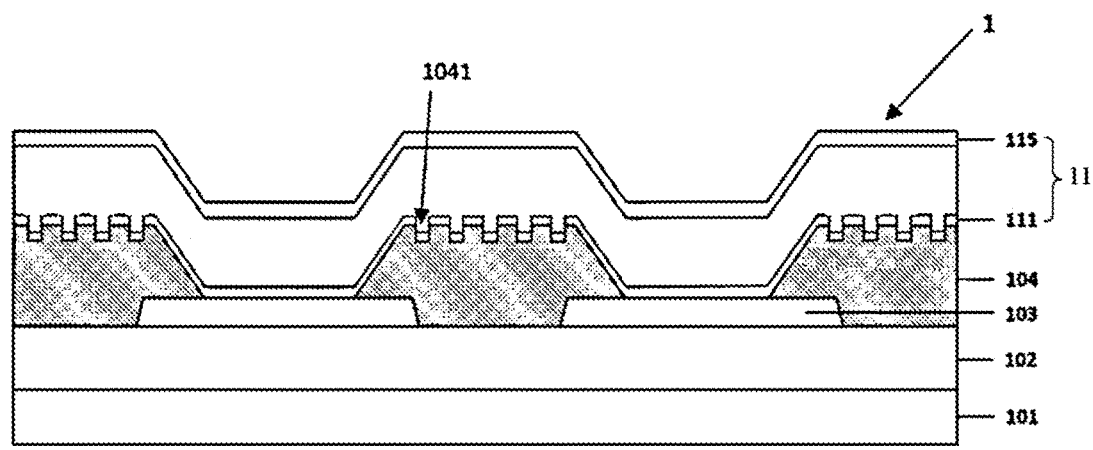
FIG. 1 shows a schematic cross-sectional view of an organic light-emitting diode (OLED) display device including a strip-shaped groove portion according to one embodiment of the present disclosure.

The following is a description of each embodiment with reference to additional figures to illustrate specific embodiments in which the present disclosure can be implemented. The directional terms mentioned in the present disclosure, such as up, down, front, back, left, right, inside, outside, side, etc., are only directions referring to the figures. Therefore, the directional terms are to explain and understand the disclosure, not to limit it.

In the figure, similarly structured units are denoted by the same reference numerals.

Please refer to FIG. 1, FIG. 1 shows a schematic cross-sectional view of an organic light-emitting diode (OLED) display device including a strip-shaped groove portion according to one embodiment of the present disclosure. The present disclosure provides an organic light-emitting diode (OLED) display device, including: a substrate 101; a thin-film transistor array substrate 102 disposed on the substrate 101; a plurality of anodes 103 disposed on the thin-film transistor array substrate 102; a pixel-defining layer 104 disposed between the plurality of anodes 103 on the thin-film transistor array substrate 102 and separating the plurality of anodes 103, wherein a plurality of strip-shaped grooves 1041 are provided on the pixel-defining layer 104; a light-emitting functional layer 11 covering the plurality of anodes 103 and the pixel-defining layer 104; and a cathode 115 disposed on the light-emitting functional layer 11, wherein the light-emitting functional layer 11 includes a hole injection layer 111 covering the plurality of anodes 103 and the pixel-defining layer 104, and a thickness of the hole injection layer 111 is less than a depth of the plurality of strip-shaped grooves 1041.

Figure 2:
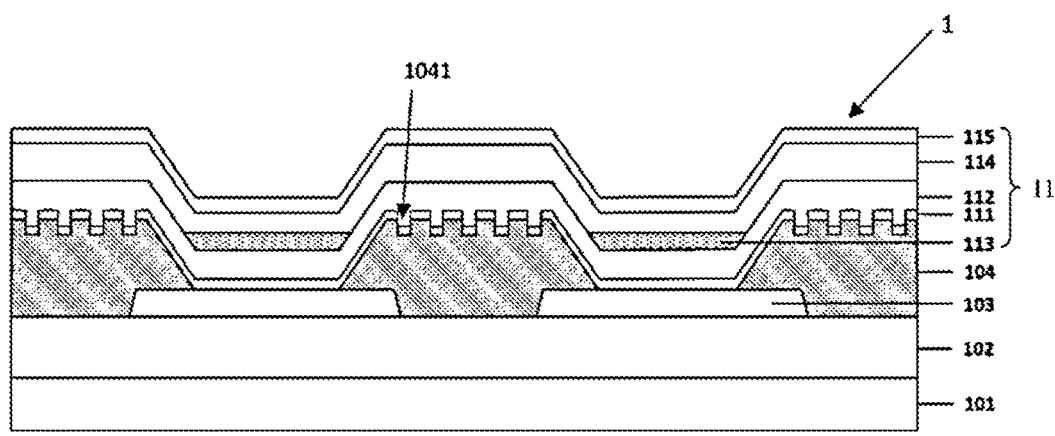
FIG. 2 shows a schematic cross-sectional view of the OLED display device including a strip-shaped groove portion according to one embodiment of the present disclosure.

Please refer to FIG. 2, FIG. 2 shows a schematic cross-sectional view of the OLED display device including a strip-shaped groove portion according to one embodiment of the present disclosure. In one embodiment, the light-emitting functional layer 11 further includes a hole injection layer 111, wherein a hole transport layer 112, a light-emitting layer 113, an electron transport and electron injection layer 114, and a cathode 115 are sequentially disposed on the hole injection layer 111, and the plurality of strip-shaped grooves 1041 block a lateral current between each of a plurality of pixel regions.

Preferably, in one embodiment of the present disclosure, a width of each of the plurality of strip-shaped grooves 1041 ranges from 0.1 µm to 30 µm, and a depth of each of the plurality of strip-shaped grooves ranges from 10 nm to 200 nm.

In one embodiment of the present disclosure, the substrate 101 is a rigid substrate or a flexible substrate. A material of the rigid substrate is preferably glass, and a material of the flexible substrate is preferably a polyimide film.

Figure 3:
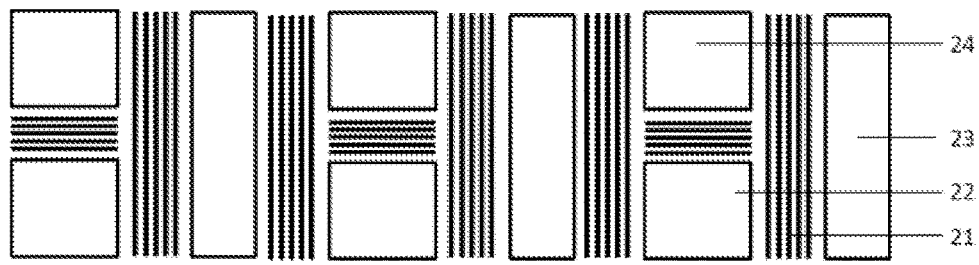
FIG. 3 shows a schematic plan view of the OLED display device according to one embodiment of the present disclosure.

Please refer to FIG. 3, FIG. 3 shows a schematic plan view of the OLED display device according to one embodiment of the present disclosure. The schematic view includes pixel regions 22, 23, and 24, and a plurality of strip-shaped grooves 21, wherein a groove extending direction of each of the plurality of strip-shaped grooves 21 between the pixel regions 22 24 is perpendicular to a groove extending direction of each of the plurality of strip-shaped grooves 21 between the pixel regions 22, 24 and 23; and the plurality of strip-shaped grooves 21 between the pixel regions 22 and 24 are not connected with the plurality of strip-shaped grooves 21 between the pixel regions 22, 24 and 23. In other words, in one embodiment, the plurality of strip-shaped grooves 21 include at least two groove extending directions perpendicular to each other, and the grooves with different groove extending directions are not connected.

Alternatively, in one embodiment of the present disclosure, a groove extending direction of each of the plurality of strip-shaped grooves is perpendicular to a direction of a connection line of two midpoints of the anodes adjacent to the strip-shaped groove. Alternatively, in one embodiment of the present disclosure, a groove extending direction of each of the plurality of strip-shaped grooves is perpendicular to a direction of a connection line of two midpoints of the anodes adjacent to the strip-shaped groove, and the grooves with different groove extending directions are not connected.

Figure 4:
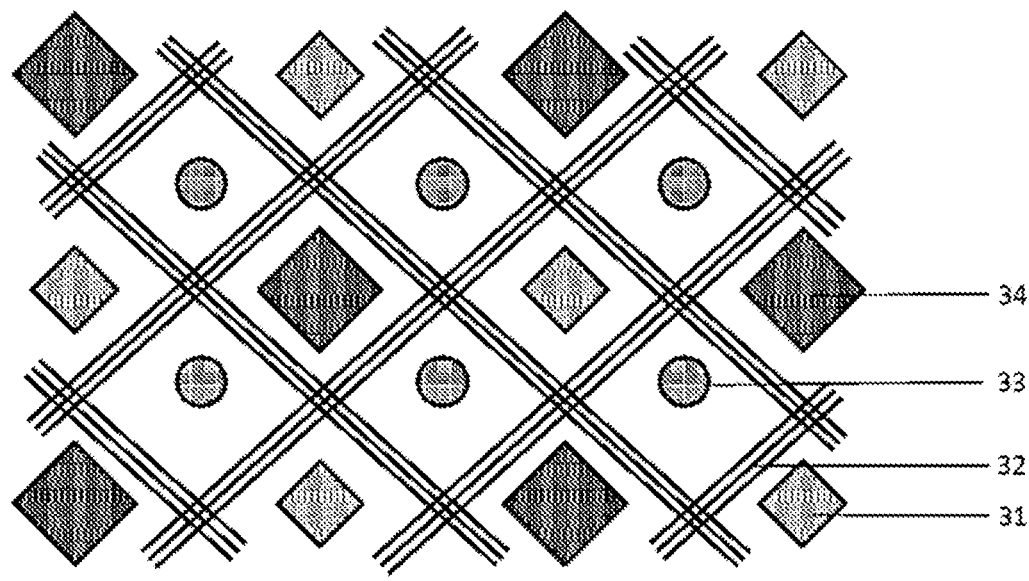
FIG. 4 shows a schematic plan view of the OLED display device according to one embodiment of the present disclosure.

Please refer to FIG. 4, FIG. 4 shows a schematic plan view of the OLED display device according to one embodiment of the present disclosure, which shows pixel regions 31, 33, and 34, and a plurality of strip-shaped grooves 32. In one embodiment of the present disclosure, a groove extending direction of each of the plurality of strip-shaped grooves 32 between the pixel regions 31 and 33 is not perpendicular to a groove extending direction of each of the plurality of strip-shaped grooves 32 between the pixel regions 33 and 34, and the groove extending direction of each of the plurality of strip-shaped grooves 32 between the pixel regions 31 and 33 is connected to each of the plurality of strip-shaped grooves 32 between the pixel regions 33 and 34.

Further, in some embodiments of the present disclosure, an included angle of the groove extending direction of each of the plurality of strip-shaped grooves and a direction of a connection line of two midpoints of the anodes adjacent to the strip-shaped grooves ranges from 60 to 90 degrees.

The arrangement manner of the plurality of strip-shaped grooves described in the present disclosure is not limited to the above description. In some embodiments of the present disclosure, the plurality of strip-shaped grooves are provided on a part of the pixel-defining layer, and the remaining parts of the pixel-defining layer are not provided with the strip-shaped grooves. For example, the plurality of strip-shaped grooves are provided on a bending area and around the bending area of the pixel-defining layer to further relieve a problem of current crosstalk in a fragile structure of the OLED display device.

Alternatively, some embodiments of the present disclosure further provide an arrangement manner of the plurality of strip-shaped grooves determined according to characteristics of the plurality of pixel regions. For example, in one embodiment of the present disclosure, each of the plurality of strip-shaped grooves is provided between each pixel region. In one embodiment of the present disclosure, each of the plurality of strip-shaped grooves is provided between pixel regions emitting different colored light. In one embodiment of the present disclosure, each of the plurality of strip-shaped grooves is provided between pixel regions of different sizes. In one embodiment of the present disclosure, each of the plurality of strip-shaped grooves is provided between pixel regions of different shapes. Thereby, the problem of current crosstalk caused by a difference in current between different pixel regions is further relieved.

Figure 5:
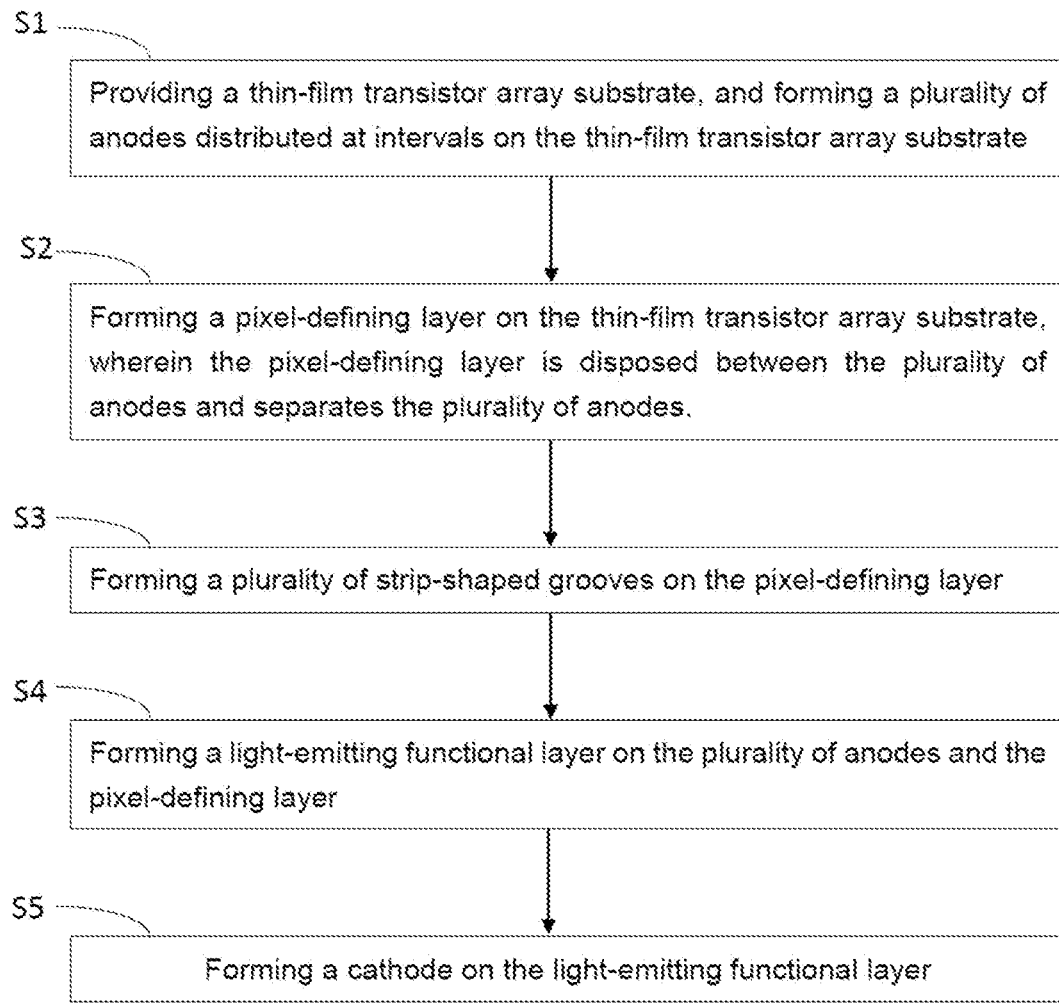
FIG. 5 shows a schematic flowchart of a method of manufacturing the OLED display device according to one embodiment of the present disclosure.

Please refer to FIG. 5. FIG. 5 shows a schematic flowchart of a method of manufacturing the OLED display device according to one embodiment of the present disclosure, including following steps:

Step S1: Providing a thin-film transistor array substrate, and forming a plurality of anodes distributed at intervals on the thin-film transistor array substrate.

Step S2: Forming a pixel-defining layer on the thin-film transistor array substrate, wherein the pixel-defining layer is disposed between the plurality of anodes and separates the plurality of anodes.

Step S3: Forming a plurality of strip-shaped grooves on the pixel-defining layer.

Step S4: Forming a light-emitting functional layer on the plurality of anodes and the pixel-defining layer.

Step S5: Forming a cathode on the light-emitting functional layer.

The light-emitting functional layer comprises a hole injection layer covering the plurality of anodes and the pixel-defining layer, and a thickness of the hole injection layer is less than a depth of the plurality of strip-shaped grooves.

In one embodiment of the present disclosure, a method of forming the plurality of strip-shaped grooves includes an etching method; or, in one embodiment of the present disclosure, a method of forming the plurality of strip-shaped grooves includes laser writing method; or, in one embodiment of the present disclosure, a method of forming the plurality of strip-shaped grooves includes etching method and laser direct writing method.

In summary, the present disclosure provides an OLED display device and a manufacturing method thereof. The OLED display device includes a substrate, a thin film transistor array substrate, a plurality of anodes, a pixel-defining layer disposed with a plurality of strip-shaped grooves, a hole injection layer, and a hole transport layer, a light-emitting layer, an electron transport and electron injection layer, and a cathode sequentially disposed on the hole injection layer, wherein each of a plurality of pixel regions includes a portion of anode not covering by the pixel-defining layer and a region corresponding the cathode, and the plurality of strip-shaped grooves block a lateral current between each of the pixel regions, thereby relieving the problem of current crosstalk between adjacent pixels.

The above description only the preferred embodiments of the present disclosure. It should be noted that for those of ordinary skill in the art without departing from the principles of the present disclosure, several improvements and adjustments can be made, and these improvements and adjustments should also be considered in the protection scope of the present disclosure.

What is claimed is:

1. An organic light-emitting diode (OLED) display device, comprising:
   a substrate;
   a thin-film transistor array substrate disposed on the substrate;
   a plurality of anodes disposed on the thin-film transistor array substrate;
   a pixel-defining layer disposed between the plurality of anodes on the thin-film transistor array substrate and separating the plurality of anodes, wherein a plurality of strip-shaped grooves are provided on the pixel-defining layer;
   a light-emitting functional layer covering the plurality of anodes and the pixel-defining layer; and
   a cathode disposed on the light-emitting functional layer;
   wherein the light-emitting functional layer comprises a hole injection layer covering the plurality of anodes and the pixel-defining layer, and a thickness of the hole injection layer is less than a depth of the plurality of strip-shaped grooves;
   wherein the plurality of strip-shaped grooves comprise at least two groove extending directions perpendicular to each other, and the grooves with different groove extending directions are not connected.

2. The OLED display device as claimed in claim 1, wherein a width of each of the plurality of strip-shaped grooves ranges from 0.1μm to 30μm, and a depth of each of the plurality of strip-shaped grooves ranges from 10 nm to 200 nm.

3. The OLED display device as claimed in claim 1, wherein the substrate is a rigid substrate or a flexible substrate, the rigid substrate is preferably a glass, and the flexible substrate is preferably a polyimide film.

4. The OLED display device as claimed in claim 1, wherein a groove extending direction of each of the plurality of strip-shaped grooves is perpendicular to a direction of a connection line of two midpoints of the anodes adjacent to the strip-shaped grooves.

5. The OLED display device as claimed in claim 1, wherein an included angle of a groove extending direction of each of the plurality of strip-shaped grooves and a direction of a connection line of two midpoints of the anodes adjacent to the strip-shaped grooves ranges from 60 to 90 degrees.

6. The OLED display device as claimed in claim 1, wherein the strip-shaped grooves with different groove extending directions are staggered with each other.

7. The OLED display device as claimed in claim 1, wherein the light-emitting functional layer further comprises a hole transport layer, a light-emitting layer, an electron transport layer, and an electron injection layer sequentially disposed on the hole injection layer.

8. A method of manufacturing an organic light-emitting diode (OLED) display device, comprising following steps:
   providing a thin-film transistor array substrate, and forming a plurality of anodes distributed at intervals on the thin-film transistor array substrate;
   forming a pixel-defining layer on the thin-film transistor array substrate, wherein the pixel-defining layer is disposed between the plurality of anodes and separates the plurality of anodes;
   forming a plurality of strip-shaped grooves on the pixel-defining layer;
   forming a light-emitting functional layer on the plurality of anodes and the pixel-defining layer; and
   forming a cathode on the light-emitting functional layer;
   wherein the light-emitting functional layer comprises a hole injection layer covering the plurality of anodes and the pixel-defining layer.

9. The method of manufacturing the OLED display device according to claim 8, wherein a thickness of the hole injection layer is less than a depth of the plurality of strip-shaped grooves.

10. The method of manufacturing the OLED display device as claimed in claim 8, wherein a width of each of the plurality of strip-shaped grooves ranges from 0.1 μm to 30 μm, and a depth of each of the plurality of strip-shaped grooves ranges from 10 nm to 200 nm.

11. The method of manufacturing the OLED display device as claimed in claim 8, wherein the plurality of strip-shaped grooves comprise at least two groove extending directions perpendicular to each other, and the grooves with different groove extending directions are not connected.

12. The method of manufacturing the OLED display device as claimed in claim 8, wherein a groove extending direction of each of the plurality of strip-shaped grooves is perpendicular to a direction of a connection line of two midpoints of the anodes adjacent to the strip-shaped grooves.

13. The method of manufacturing the OLED display device as claimed in claim 8, wherein an included angle of a groove extending direction of each of the plurality of strip-shaped grooves and a direction of a connection line of two midpoints of the anodes adjacent to the strip-shaped grooves ranges from 60 to 90 degrees.

14. The method of manufacturing the OLED display device as claimed in claim 8, wherein the plurality of strip-shaped grooves comprise at least two groove extending directions, and the strip-shaped grooves with different groove extending directions are staggered with each other.

15. An OLED display device, comprising:
   a substrate
   a thin-film transistor array substrate disposed on the substrate;
   a plurality of anodes disposed on the thin-film transistor array substrate;
   a pixel-defining layer disposed between the plurality of anodes on the thin-film transistor array substrate and separating the plurality of anodes, wherein the pixel-defining layer comprises a plurality of strip-shaped grooves;
   a light-emitting functional layer covering the plurality of anodes and the pixel-defining layer; and
   a cathode disposed on the light-emitting functional layer;
   wherein the light-emitting functional layer comprises a hole injection layer covering the plurality of anodes and the pixel-defining layer, a thickness of the hole injection layer is less than a depth of the plurality of strip-shaped grooves, a width of each of the plurality of strip-shaped grooves ranges from 0.1μm to 30μm, a depth of each of the plurality of strip-shaped grooves ranges from 10 nm to 200 nm, and the light-emitting functional layer further comprises a hole transport layer, a light-emitting layer, and an electron transport and electron injection layer which are sequentially disposed on the hole injection layer.

16. The OLED display device as claimed in claim 15, wherein the plurality of strip-shaped grooves comprise at least two groove extending directions perpendicular to each other, and the grooves with different groove extending directions are not connected.

17. The OLED display device as claimed in claim 15, wherein a groove extending direction of each of the plurality of strip-shaped grooves is perpendicular to a direction of a connection line of two midpoints of the anodes adjacent to the strip-shaped grooves.

18. The OLED display device as claimed in claim 15, wherein an included angle of a groove extending direction of each of the plurality of strip-shaped grooves and a direction of a connection line of two midpoints of the anodes adjacent to the strip-shaped groove ranges from 60 to 90 degrees.

19. The OLED device as claimed in claim 15, wherein the plurality of strip-shaped grooves comprise at least two groove extending directions, and the strip-shaped grooves with different groove extending directions are staggered with each other.

* * * * *